(12) United States Patent
Cassetti et al.

(10) Patent No.: US 11,431,351 B2
(45) Date of Patent: Aug. 30, 2022

(54) SELECTION OF DATA COMPRESSION TECHNIQUE BASED ON INPUT CHARACTERISTICS

(71) Applicant: Intel Corporation, Santa Clara, CA (US)

(72) Inventors: David K. Cassetti, Tempe, AZ (US); Stephen T. Palermo, Chandler, AZ (US); Sailesh Bissessur, Phoenix, AZ (US); Patrick Fleming, Slatt Wolfhill (IE); Lokpraveen Mosur, Gilbert, AZ (US); Smita Kumar, Chandler, AZ (US); Pradnyesh S. Gudadhe, Chandler, AZ (US); Naveen Lakkakula, Chandler, AZ (US); Brian Will, Phoenix, AZ (US); Atul Kwatra, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/297,577

(22) Filed: Mar. 8, 2019

(65) Prior Publication Data
US 2019/0207624 A1 Jul. 4, 2019

Related U.S. Application Data

(60) Provisional application No. 62/779,954, filed on Dec. 14, 2018, provisional application No. 62/779,950, filed on Dec. 14, 2018.

(51) Int. Cl.
*H03M 7/34* (2006.01)
*H03M 7/30* (2006.01)
(Continued)

(52) U.S. Cl.
CPC ........ *H03M 7/3086* (2013.01); *G06F 40/126* (2020.01); *G06F 40/149* (2020.01);
(Continued)

(58) Field of Classification Search
CPC ............. H03M 5/00; H03M 7/00; H03M 7/42
(Continued)

(56) References Cited

U.S. PATENT DOCUMENTS 8,248,279 B2 8/2012 Buckingham et al.
10,187,081 B1 * 1/2019 Diamant ............. H03M 7/3088
(Continued)

OTHER PUBLICATIONS

P. Deutsch, "Deflate Compressed Data Format Specification version 1.3", Network Working Group, Aladdin Enterprises, May 1996, 12 pages.
(Continued)

*Primary Examiner* — Joseph J Lauture
(74) *Attorney, Agent, or Firm* — Compass IP Law PC

(57) ABSTRACT

A compression scheme can be selected for an input data stream based on characteristics of the input data stream. For example, when the input data stream is searched for pattern matches, input stream characteristics used to select a compression scheme can include one or more of: type and size of an input stream, a length of a pattern, a distance from a start of where the pattern is to be inserted to the beginning of where the pattern occurred previously, a gap between two pattern matches (including different or same patterns), standard deviation of a length of a pattern, standard deviation of a distance from a start of where the pattern is to be inserted to the beginning of where the pattern occurred previously, or standard deviation of a gap between two pattern matches. Criteria can be established whereby one or more characteristics are used to select a particular encoding scheme.

20 Claims, 12 Drawing Sheets

(51) Int. Cl.
*H03M 7/40* (2006.01)
*G06F 40/126* (2020.01)
*G06F 40/149* (2020.01)
*G06F 40/157* (2020.01)
*G06F 40/284* (2020.01)
*H03M 7/00* (2006.01)
*H03M 5/00* (2006.01)
*H03M 7/42* (2006.01)

(52) U.S. Cl.
CPC .......... *G06F 40/157* (2020.01); *G06F 40/284* (2020.01); *H03M 7/3088* (2013.01); *H03M 7/40* (2013.01); *H03M 7/6023* (2013.01); *H03M 7/6029* (2013.01); *H03M 5/00* (2013.01); *H03M 7/00* (2013.01); *H03M 7/3079* (2013.01); *H03M 7/42* (2013.01)

(58) Field of Classification Search
USPC ............................................ 341/50, 51, 106
See application file for complete search history.

(56) References Cited

U.S. PATENT DOCUMENTS

| | | |
|---|---|---|
| 10,224,957 B1 | 3/2019 | Cassetti et al. |
| 2019/0123763 A1 | 4/2019 | Bissessur et al. |
| 2019/0273507 A1 | 9/2019 | Cassetti et al. |

OTHER PUBLICATIONS

Suman M. Choudary, et al., "Study of LZ77 and LZ78 Data Compression Techniques", International Journal of Engineering Science and Innovative Technology (IJESIT) vol. 4, Issue 3, May 2015, 5 pages.

Notice of Allowance for U.S. Appl. No. 16/297,579, dated Sep. 25, 2019, 9 pages.

Notice of Allowance for U.S. Appl. No. 16/297,579, dated Feb. 5, 2020, 9 pages.

* cited by examiner

| File SIZE | File TYPE | Percentage of Search MATCH Length (Match Len) Lengths | | | Percentage of Search Distance (Dis) OFFSET Lengths | | | | Percentage of Search Literal Length (Lit Len) | | | | Standard Deviation of Match Len Freq Counts | Standard Deviation of Dis Freq Counts | Standard Deviation of Lit Len Freq Counts | SELECTED Compression Algorithm |
|---|---|---|---|---|---|---|---|---|---|---|---|---|---|---|---|---|
| | | [0-7] | [8-15] | [16-63] | [64+] | [0-7] | [8-15] | [16-63] | [64+] | [0-7] | [8-15] | [16-63] | [64+] | | | | |
| >1KB | TEXT | >60% | * | * | <5% | * | * | * | <10% | <40% | >20% | * | * | <10% | * | <15% | ZSTD |
| >1KB | IMAGE | * | * | * | >15% | >30% | * | * | <10% | * | * | * | * | * | <8% | >50% | DEFLATE Dynamic |
| <1KB | IMAGE | * | * | * | >15% | >30% | * | * | <10% | * | * | * | * | * | * | * | DEFLATE Static |

FIG. 2

SELECTION OF DATA COMPRESSION TECHNIQUE BASED ON INPUT CHARACTERISTICS

RELATED APPLICATIONS

The present application claims the benefit of priority date of U.S. provisional patent application Ser. No. 62/779,954, filed Dec. 14, 2018, the entire disclosure of which is incorporated herein by reference.

The present application claims the benefit of priority date of U.S. provisional patent application Ser. No. 62/779,950, filed Dec. 14, 2018, the entire disclosure of which is incorporated herein by reference.

The present application is related to "DATA COMPRESSION ENGINE FOR DICTIONARY BASED LOSSLESS DATA COMPRESSION," Ser. No. 16/228,300, filed Dec. 20, 2018.

The present application is related to "COMPRESSION SCHEME WITH CONTROL OF SEARCH AGENT ACTIVITY," Ser. No. 16/297,579, filed Mar. 8, 2019.

TECHNICAL FIELD

Various examples described herein relate to techniques for encoding or compressing data.

BACKGROUND

Data can be compressed using a lossless or lossy compression algorithm to reduce the amount of data required to store or transmit digital content. Lossless compression algorithms reconstruct the original message exactly from the compressed representation. By contrast, lossy compression algorithms can reconstruct the original message but with lost data or reduced quality. Lossless data compression algorithms include Lempel-Ziv (LZ) algorithms such as LZ77 and LZ4. Applications that perform file compression and decompression and that can use LZ lossless data compression algorithms include GNU zip (gzip), GIF (Graphics Exchange Format) and Zstandard.

A dictionary coder is a class of lossless data compression algorithms that operates by searching for a match between text in the message to be compressed and a set of strings in a "dictionary" maintained by an encoder. When the encoder finds a match for a string in the message, it substitutes the string with a reference to the string's position in the dictionary.

BRIEF DESCRIPTION OF THE DRAWINGS

FIG. 2 depicts an example table that illustrates a scheme that can be used to select a compression scheme in accordance with an embodiment.

DETAILED DESCRIPTION

Figure 1:
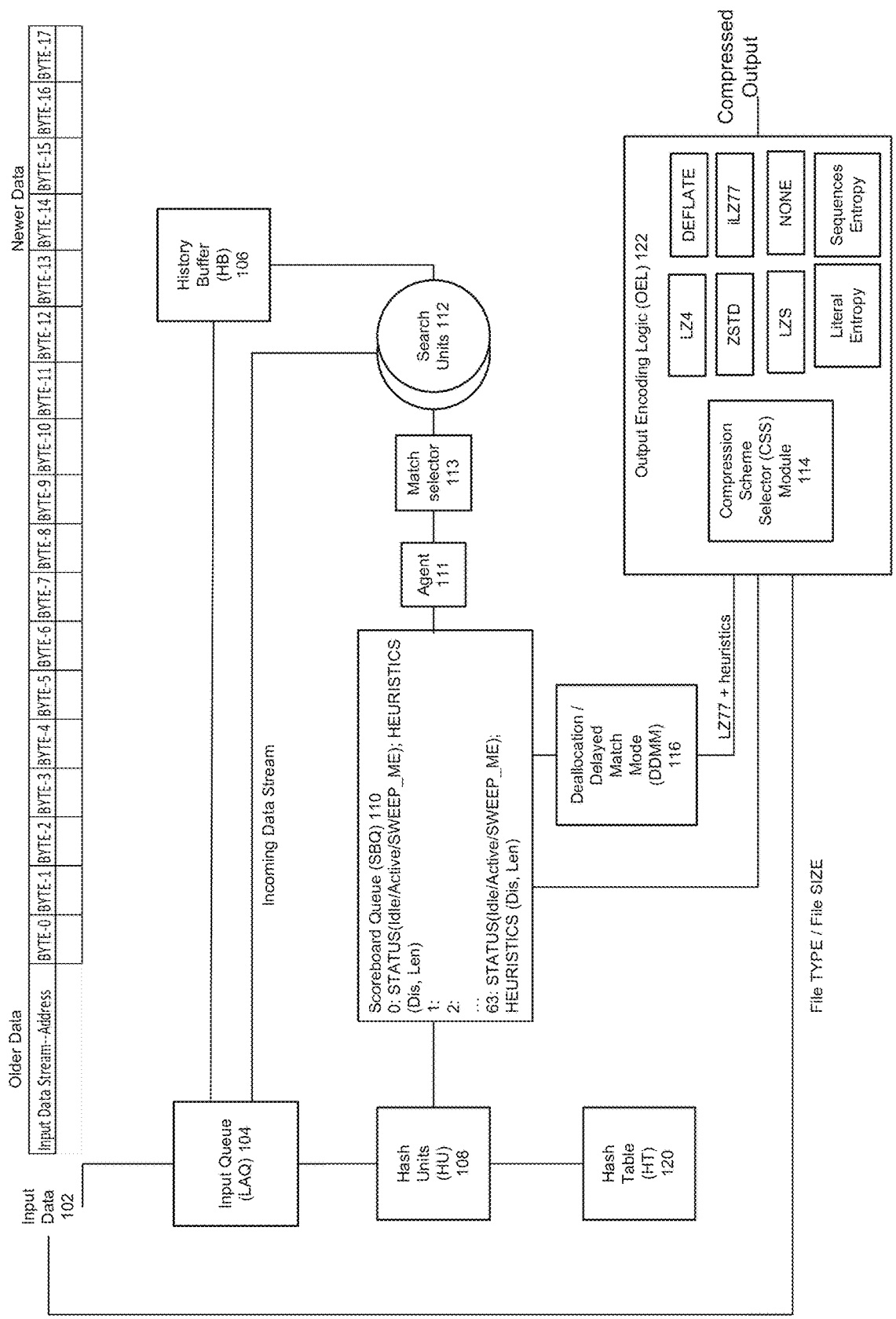
FIG. 1 depicts a block diagram of a compression engine in accordance with an embodiment.

An encoder that uses an LZ lossless data compression algorithm to compress an input stream data uses prior input data information of the input data stream that can be referred to as "history." The LZ lossless data compression algorithm searches the history for a string that matches a later portion of the input data stream. If such a match is found, the encoder encodes the matched later portion of the input data using a reference (length and offset) to the matching string in the history. Otherwise, the encoder encodes a next character of the input data stream as a raw data code or a "literal" that designates the character as plain text or clear text. The just encoded portion of the input data stream is then added to the history and is included in the search to match the next portion of the input data stream. The history can be stored in a fixed size, sliding window type buffer, from which the oldest data exits as new data from the input data stream is added.

The LZ algorithms dynamically build a dictionary while uncompressed data is received and compressed data is transmitted. In some cases, no additional data is transmitted with the compressed data to allow the compressed data to be decompressed. The dictionary is dynamically rebuilt while the compressed data is decompressed. The LZ algorithms support compression at least of text, images, and videos.

Accordingly, with an encoder that uses an LZ lossless data compression algorithm, an input data stream is encoded with respect to preceding data in that same input data stream. The encoder that uses an LZ lossless data compression algorithm can achieve compression of the input data stream because the reference (offset and length) to the matching string can be much smaller than a portion of the input data stream that the reference represents.

Common metrics used to indicate the effectiveness and efficiency of a particular algorithm include compression ratio (e.g., a measure of compressed file size compared to original file size) and compression/decompression throughput (e.g., the time it takes to compress the original data files and the time taken to decompress the compressed files). Data compression performance depends primarily on the type of data (e.g., text, image, or media) and algorithm used. Different algorithms produce different compression ratios and throughputs for different types of data forms. Furthermore, different customer applications may want to optimize different aspects of the compression/decompression process. For example, cloud service providers may want to optimize compression throughput for image file uploads and forgo optimum compression ratios. Terrestrial-based Communication Service Provider customers may want to optimize compression ratio, possibly at the expense of throughput, to minimize the amount of network bandwidth is used to transfer digital data. Low Earth Satellite network providers may want to optimize throughput time to mitigate inherent earth to satellite latencies.

Various embodiments provide for dynamic auto-selection of a compression scheme to apply to an input data stream based at least on one or more input stream characteristics. A compression scheme could be pre-selected and can be adjusted during use of compression. Various compressions schemes are available to be selected such as but not limited to Lempel Ziv (LZ) family of compression schemes including LZ77, LZ78, LZ4, Zstandard (ZSTD), DEFLATE, and Snappy standards and derivatives, among others. In some cases, lossy compression schemes can be selected. A compression scheme can be chosen based on one or more of the following input stream characteristics: type and size of an input stream, a length of a character string pattern, a distance from a start of where the pattern is to be inserted to the beginning of where the pattern occurred previously, a gap between two pattern matches (including different or same patterns), standard deviation of a length of a pattern, standard deviation of a distance from a start of where the pattern is to be inserted to the beginning of where the pattern occurred previously, or standard deviation of a gap between two pattern matches.

Various embodiments described herein can be used in a central processing unit (CPU), network interface products, hardware accelerator devices, and other implementations. Various embodiments can be used with lossless searching mechanisms for inline or lookaside data inputs for example in network interface controller or device or central processing unit implementations.

FIG. 1 depicts a block diagram of a compression engine that selects a compression scheme to apply to an input data stream. A compression engine captures and analyzes heuristics during hash and search stages to select a lossless encoding algorithm. Heuristics can include one or more of: search string match length ("Len"), search distance offset from the search string match to a prior instance of the string ("Dis"), and a literal length distance between two pattern matches, expressed in length of the literals, from an end of a first pattern to start of a second pattern, where the second pattern is the same or different than the first pattern ("Lit Len"), as well as input stream size and input stream type. Lossless encoding schemes can include encoding schemes such as the LZ family including, but not limited to, LZ77, LZ4, LZS, Zstandard, DEFLATE, Huffman coding, and Snappy standards and derivatives. For example, Appendix 1 provides example descriptions of some encoding schemes including DEFLATE, Huffman, and LZ4. For example, LZ77 streams are described in Ziv et al., "A Universal Algorithm for Sequential Data Compression" IEEE Transactions on Information Theory (May 1977).

The following provides an example operation of the system of FIG. 1. Input data 102 is written into Look-Aside-Queue (LAQ) 104. Input data 102 can be uncompressed data of raw data code or a "literal" that designates the character as plain text or clear text. Input data 102 can be segmented at a character level or byte level. A byte can be a character for ASCII scheme. Other schemes can be used to represent characters such as UTF-8, where a character can span more than 1 byte.

Three pointers can be associated with Look-Aside-Queue 104, namely, a tail pointer, a head pointer, and a current pointer. The received uncompressed data 102 is inserted at the tail of LAQ 104. The tail pointer stores the location (entry) in LAQ 104 in which data can be inserted in LAQ 104. The head pointer identifies the entries in the LAQ 104 that store data that has been compressed using an encoder and can be flushed from LAQ 104. After data from LAQ 104 has gone through encoding, the data at the head pointer is flushed into HB 106 at the HB write pointer. The number of bytes flushed to HB 106 can vary depending on implementation and compression standard. The current pointer refers to the position at which the Hash Units 108 will get their next input data, and normally advances by the number of HUs 108 (e.g., 8 bytes). A HU is assigned a current stream position (e.g., "LQA", as in FIG. 3).

In some examples, hash units (HU) 108 can perform hash operations on 3 to 4 byte groups of input data from LAQ 104 to determine History Buffer Addresses (HBAs) of potential prior data positions where a match could be found. For example, compression scheme LZ4 uses a 4-byte hash function, whereas compression scheme DEFLATE uses a 3-byte hash function. Sizes other than 3 to 4 bytes can be used such as 1 byte, 2 bytes, 5 bytes, and so forth. In an example where HU 108 performs hash and lookup operations on 8 groups of bytes in parallel (e.g., groups with bytes 0-2, 1-3, 2-4, 3-5, 4-6, 5-7, 6-8, and 7-9 represented as groups 0 to 7 respectively), HU 108 can read groups 0-7 from LAQ 104 starting at the LAQ current position. For a 3-byte hash as an example, if the bytes in LAQ 104 are "ABCDEFGHIJKLMN", then 8 hash functions are performed on the 3 bytes: "ABC", "BCD", "CDE", "DEF", "EFG", "FGH", GHI, and "HIJ". HU 108 hashes groups 0-7 and can search the hash results against hashes stored in hash table 120. A hash function is applied to produce a 12-bit hash table index, for example.

Hash table (HT) 120 can store hash values/index values and corresponding HBAs. In some embodiments, there are 32 banks of HT memory in order to reduce the average number of bank conflicts from the 8 Hash Units 108 read requests to the HT. A bank can provide up to 16 HBAs to the HU 108 requesting the bank. In some embodiments, 16 parallel Hash Tables (HTs) 120 are provided, allowing storing and retrieving up to 16 HBAs with a single hash table index. Retrieving up to 16 HBAs allows for up to 16 search operations for a given byte position. The hash index provides the read address (bank number plus location within the bank) to retrieve the HBAs. HT 120 can provide corresponding HBAs (e.g., up to 16) for a hash index. If there is no entry for a hash index in HT 120, HT 120 provides no HBA or an indication of an invalid entry. An HBA represents a prior stream position that is a potential match with a current group position. HU 108 can write a group position (e.g., 0-7) for the first 8 bytes of input data and corresponding hash index into an entry in HT 120. For subsequent input bytes, the group position would increase. A hash index can be the location (address) in the HT that can be read, written-to, or overwritten.

Hash Unit 108 compares the current stream position (LQA) against the retirement pointer when updating its corresponding SBQ entry or entries. A retirement pointer can indicate a position of the input data that has not been encoded into an LZ77 stream (or other stream) and is next in line to be encoded. The retirement pointer is updated during the encoding stage based on characters provided for inclusion in the LZ77 stream. The retirement pointer can indicate a position of the input data that has not been encoded into an LZ77 stream (or other stream) and is next in line to be encoded. If the retirement pointer is greater than the current stream position (LQA), Hash Unit 108 will set the Squash Bit (SQH) when updating its corresponding SBQ entry or entries.

HU 108 outputs to SBQ 110 identified history addresses (HBAs) and a valid indication (e.g., present in the HT 120 and in range of the History Buffer window). Agent 111 monitors SBQ 110 and in response to valid HBAs being available, agent 111 triggers one or more search units (SUs) 112 to perform a search for a prior portion of input data 102.

SUs 112 attempt to find data string(s) from LAQ 104 or HB 106 using the HBA to find a match for an input data string. SUs 112 retrieve from SBQ 110 one or more of (entry number, Stream ADDR (e.g., stream position LQA), history address (HBA)). Middle bits of the HBA can be used to convert an HBA to a position or memory location in LAQ 104 or HB 106. SU 112 compares data from LAQ 104 or HB 106 provided based on the HBA with characters of a group position for which HU 108 identified a potential match. In some examples, SU 112 can process chunks of 16 bytes or other sizes.

If a match is found, SU 112 supplies the Dis and Len that is found corresponding with its stream (group) position. A match selector 113 chooses a result from multiple SUs 112 with a longest character match (Len) and if Len of several search results are the same, a result with the smallest offset (Dis) is selected. Match selector 113 provides the Len and Dis to SBQ 110 for the character string associated with the selected Len and Dis and a character string (e.g., token) is available for encoding a corresponding current group position. If no match is found between any characters of the group position that caused the HU 108 to provide the HBA and the segment retrieved from LAQ 104 or HB 106 using the HBA, a literal is available for encoding a corresponding current group position. For example, for a hash involving bytes 0-2, a result will be placed in entry 0.

In some embodiments, when SUs 112 are finished searching a group of one or more character strings, a SWEEP_ME signal is triggered. SWEEP_ME state triggers deallocation to remove one or more entries from scoreboard queue 110 and copy input strings associated with deallocated entries from LAQ 104 to history buffer 106. Note that SWEEP_ME corresponds to a SWP state described later.

History buffer (HB) 106 can be used to store clear text data or plain text data ("history data") that has been processed by an encoder. The clear text data stored in the history buffer 106 can be referred to as a "dictionary." The dictionary can be created on the fly during compression and re-created on the fly during decompression. History buffer 106 acts a sliding window/circular queue. When the history buffer 106 is full, the oldest data at the head of the history buffer 106 is overwritten by data read from LAQ 104 that has been processed by an encoder. A size of HB 106 can vary depending on a compression standard used (e.g., DEFLATE, LZ4, LZ77). For example, HB 106 can be setup as 32 KB for DEFLATE compression and 64 KB for LZ4.

Scoreboard Queue (SBQ) 110 can be used by HU 108, SUs 112, and DDMM logic 116 as an information repository. In one example, SBQ 110 can track 64 consecutive stream positions (e.g., 0 to 63, 1 to 64, 2 to 65, and so forth). A position is the starting point for attempting to search for as long a match as possible.

DDMM device 116 can use contents of the SBQ entries to generate a representation of an input data stream and the representation can be an LZ77 stream. Deallocation and delayed match mode (DDMM) device 116 receives or retrieves serial, in-order, results from SBQ 110 indicating Dis, Len, and a literal (as the case may be) for a group position. For example, DDMM device 116 receives the match results for 8 consecutive stream positions from SBQ 110 and decides which tokens will be chosen for the LZ77 stream. DDMM 116 generates an LZ77 stream with literals and zero or more tokens. DDMM 116 can generate a literal length (Lit Len) for an LZ77 stream, where literal length can represent a gap, expressed in length of the literals, between two pattern matches (e.g., tokens) from an end of a first pattern to start of a second pattern, where the second pattern is the same or different than the first pattern.

For example, DDMM 116 provides Output Encoding Logic (OEL) the following information directly or via Score Board Queue (SBQ).

| Field | Example description |
|---|---|
| Valid | Valid bits for 8 possible LZ77 results. |
| EOF | Indicates the last set of LZ77 output, or if none of the output is valid, that no more LZ77 output is available. |
| Length | Lengths for 8 LZ77 results. A length of 1 indicates a literal (value = LQB), otherwise a <Length, Distance> pair (token). |
| Distance | Distances for 8 LZ77 results. |
| Literal Length | A gap between pattern matches. |
| LQB | Leading bytes for the 8 LZ77 results (used for literals) |

Compression scheme selector (CSS) module 114 can use literal length (Lit Len) from DDMM 116 and Dis and Len from DDMM 116 or SBQ 110. CSS module 114 can select a compression engine to use (e.g., LZ4, DEFLATE, Zstandard (ZSTD), LZS, none, and so forth) to compress the LZ77 format stream and provide a compressed output. For example, compression scheme selector (CSS) module 114 can perform any of one or more: (1) calculate percentage representations of Len, Dis, Lit Len; (2) calculate standard deviations of Len, Dis, and Lit Len; (3) compare those values against pre-determined criteria; and (4) determine encoding/compression scheme for Output Encoding Logic 122 to use to encode/compress an LZ77 stream based at least on the criteria. For example, criteria for selecting a compression engine can be based on a scheme depicted in FIG. 2. Criteria for selecting an encoding scheme can be set by cloud/communications service provider or generated by artificial intelligence (AI).

FIG. 2 depicts an example table that illustrates criteria that can be used to select a compression scheme for an input data stream or portion of the input data stream. For an input stream, a compression scheme can be determined based on one or more criteria among: a size and type of an input stream, a length of a pattern (e.g., Len), a distance from a start of where the pattern is to be inserted to the beginning of where the pattern began (e.g., Dis), a gap between two pattern matches, standard deviation of a length of a pattern, standard deviation of distance from a start of where the pattern is to be inserted to the beginning of where the pattern began, or standard deviation of gap between two pattern matches. For a row, a size of an uncompressed input stream is a sequence of characters to be compressed and is shown in kilobytes and megabytes but other sizes can be used. A file type is shown as text, image, media, although other types can be used.

Criteria Percentage of Search MATCH Length (Match Len) Lengths can indicate a percentage of repeated string sizes in a file of a size and type that are needed to satisfy this column for the input stream or portion of the input stream. Match Len can be a length of a repeated character string. An entry of * indicates an entry can be satisfied with any value.

Criteria Percentage of Search Distance (Dis) OFFSET Lengths can indicate a percentage of values of Dis in a file of a size and type that are needed to satisfy this column for the input stream or portion of the input stream. Variable Dis indicates a backwards distance in history from current position back to a beginning position of the match. An entry of * indicates an entry can be satisfied with any value.

Criteria Percentage of Search Literal Length (Lit Len) indicates a percentage of values of literal length in a file of a size and type that are needed to satisfy this column for the input stream or portion of the input stream. Literal length can represent a distance between two pattern matches, expressed in length of the literals, from an end of a first pattern to start of a second pattern, where the second pattern is the same or different than the first pattern. An entry of * indicates an entry can be satisfied with any value.

Criteria Standard Deviation of Match Len Freq Counts indicates a standard deviation of variable Match Len (or Len) for the input stream or portion of the input stream. An entry of * indicates an entry can be satisfied with any value.

Criteria Standard Deviation of Dis Freq Counts indicates a standard deviation of variable Dis for the input stream or portion of the input stream. An entry of * indicates an entry can be satisfied with any value.

Criteria Standard Deviation of Lit Len Counts indicates a standard deviation of variable Lit Len for the input stream or portion of the input stream. An entry of * indicates an entry can be satisfied with any value.

For an input file size and file type that matches criteria of the table, a compression scheme can be chosen. For example, ZSTD compression scheme can be used for a file size that is 1.5 kilobytes, is a text file, has 70% of pattern matches that are 6 bytes (e.g., characters) in length and 4% of pattern matches are 68 bytes in length, has 3% of gaps between pattern matches of 70 bytes, has 30% of gap between two pattern matches of 4 bytes and 30% gap between two pattern matches of 12 bytes, standard deviation of 5% for variable Match Len (e.g., Len), and standard deviation of 10% of Lit Len.

If criteria of multiple encoding schemes are met, a priority order of encoding schemes can be applied where a higher priority scheme is selected for use. For example, if an input stream converted to LZ77 format meets criteria for ZSTD and DEFLATE Dynamic and ZSTD is a higher priority scheme than DEFLATE Dynamic, then ZSTD is used for encoding the LZ77 format stream. In other embodiments, if criteria of multiple encoding schemes are met, a less utilized encoder can be selected for use.

An example is described next for a data input of ABCDEFGABCHIJKDEF. For character string ABC, a match length (variable "Len") of 3 can be found, a distance between matches of string ABC is 7 (variable "Dis"), and a gap between two pattern matches (end of a first pattern to start of a second pattern, where the second pattern is the same or different than the first pattern) (variable "Lit Len") is 7. For character string DEF, a match length (variable "Len") of 3 can be found, a distance between beginnings of matches of string DEF is 11 (variable "Dis"), and a gap between two pattern matches (end of a first pattern to start of a second pattern, where the second pattern is the same or different than the first pattern) (Lit Len) is 4 (e.g., HIJK separated pattern DEF from pattern ABC).

Figure 3:
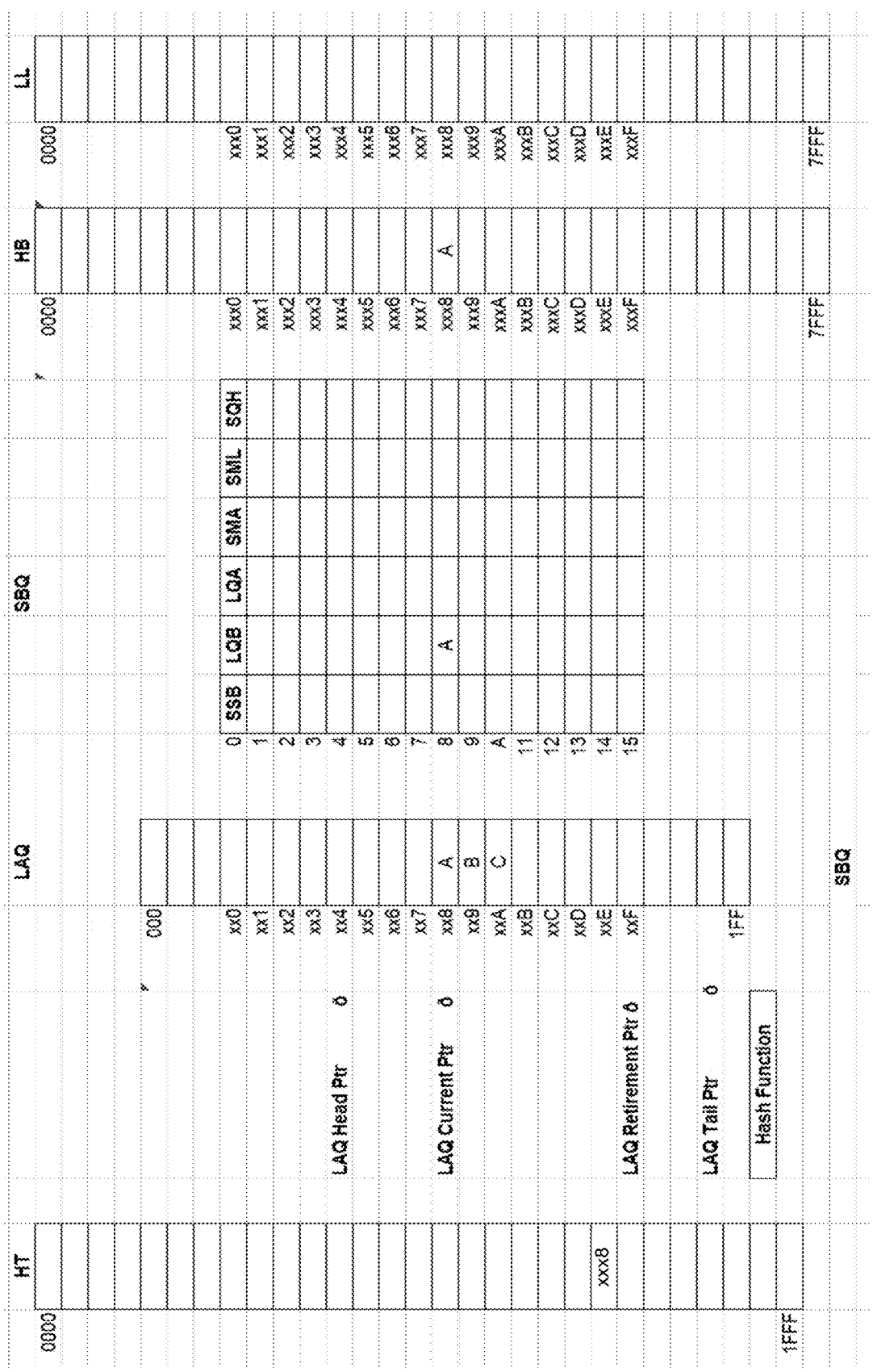
FIG. 3 depicts an example of use of a Look-Aside-Queue (LAQ) together with a scoreboard queue and history buffer in accordance with an embodiment.

FIG. 3 depicts an example of use of a Look-Aside-Queue (LAQ) together with a scoreboard queue and history buffer. Status and heuristics of entries from a scoreboard queue can be accessed to determine how to encode an input stream. The following table provides a generic list of elements stored in an SBQ entry for a group byte position index.

| Element | Example Description |
| --- | --- |
| SSB | Indicates the present SBQ state (e.g., idle state, SU state, SWP state) |
| SBQ Idle (SBI) | When set this bit indicates that the SBQ is in use. This bit is cleared after the encoding. |
| Leading LAQ Byte (LQB) | The first byte of the 3-byte or 4-byte hash that was hashed. This can be the literal byte at the stream position (from the Hash Unit). |
| Leading Byte Address (LQA) | Location in LAQ for comparing against the History Buffer location(s). This can be the stream address (from the Hash Unit). |
| History Buffer Address [0:15] | In some examples, up to 16 History Buffer Address (HBA) are read from the HT 120 by HU 108. These HBAs are used for search operations in the LAQ 104 or HB 106. |
| Match Length[n]/Match Offset Array[n] | List of search results from SUs. DDMM logic 116 can use these values to encode the input stream. |
| Search Match Offset (SMO) | Variable Dis from search units. |
| Search Match Length (SML) | Variable Len is Search Match Length (from SUs). |
| Squash bit (SQH) | DDMM logic 116 can set this bit to indicate that the leading LAQ byte has already been used by a previous match. |

Figure 4:
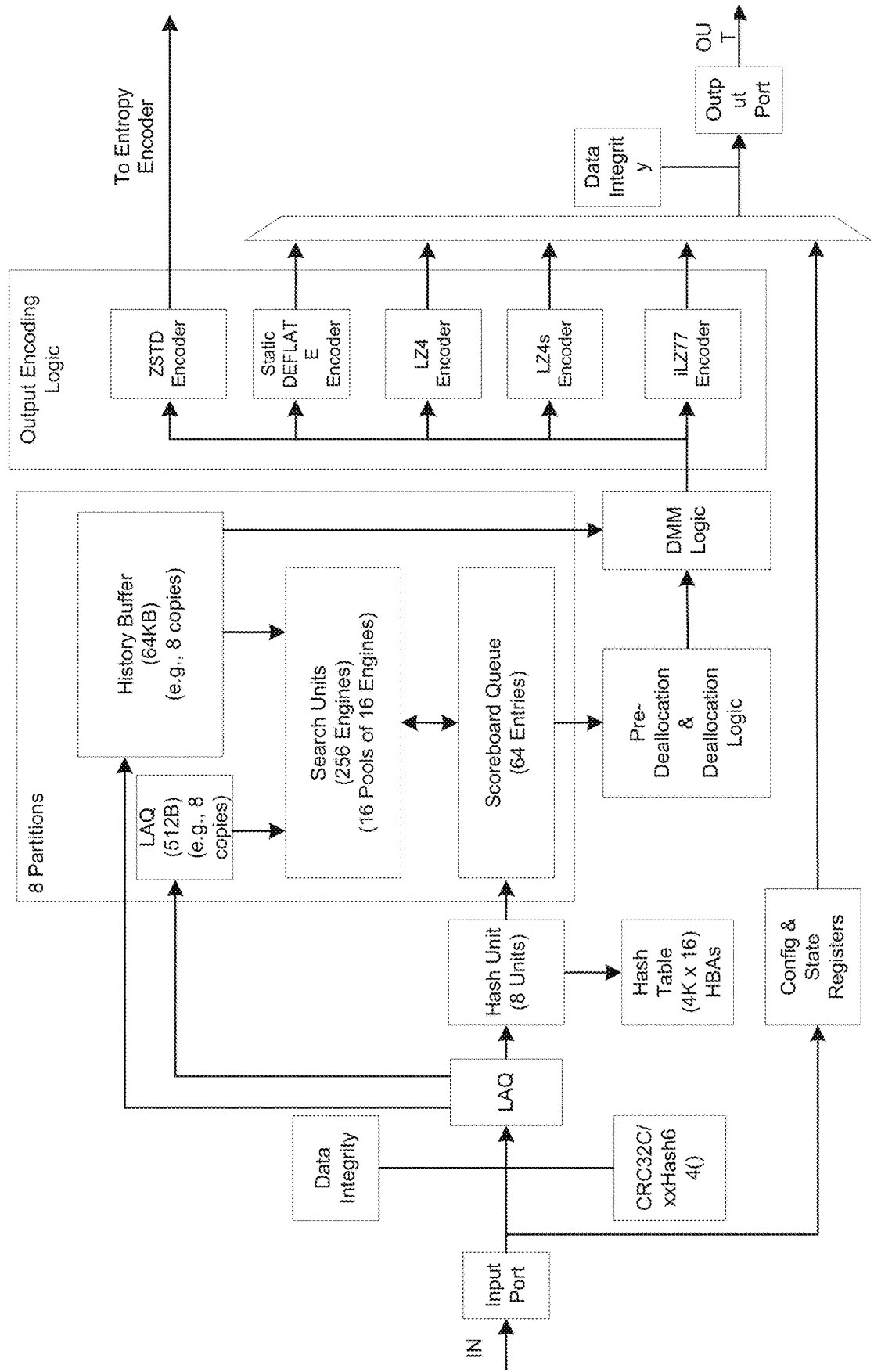
FIG. 4 depicts a compression engine in accordance with an embodiment.

FIG. 4 depicts a compression engine. The compression engine is to store input data into a History Buffer (HB) while attempting to find the longest data string from the previously stored data in the HB that can match the input data in a Look-Aside-Queue (LAQ). If a match is found, the input data is encoded as a <length, distance> token but if no match is found, the input data byte is left as is (e.g., as a literal). The compression engine initiates multiple searches of an incoming data stream to find and simultaneously encode duplicate sequences to improve throughput and size. For example, multiple Search Units (SUs) compare incoming data, placing string comparison results into Score Board Queues (SBQs) while simultaneously encoding data, using results from the SBQs, into a single compressed data stream.

In the hash stage, hash functions are performed, the History Buffer Addresses (HBA) from the Hash Tables are retrieved, and the Hash Tables are updated with HBAs for the new segments of input data. History Buffer (HB) locations are tracked using hash keys. A hash key is produced by a hash function of input bytes from an input stream and the hash key is used as an index to access a set of Hash Tables (HT). The HTs are used to store the History Buffer Addresses (HBAs) for a given hash key. The HT identification stage is where the search for the best string using the HBAs from the HTs are performed. In the encode stage, the search results stored in the SBQs are encoded in the appropriate compressed format.

Compression engine can support multiple parallel hash operations (e.g., 8) and multiple parallel pools of Search Units (SU) (e.g., 16). Each pool can contain multiple SUs (e.g., 16), organized in groups of SUs (e.g., 4). For example, with 16 pools, the compression engine can operate on up to 128 byte locations simultaneously, thereby posting results in up to 128 Score Board Queue (SBQ) entries.

Compression engine can issue 8 parallel byte search of 8 consecutive bytes from the LAQ in a single clock cycle. Eight consecutive locations of 3-bytes or 4-bytes from the LAQ are hashed in a single clock in the hash stage. Per resource availability (e.g., SBQs and SUs), the hardware will attempt to issue 8 searches every clock cycle. The HU can use the 8 hash index to read 8 sets of HBAs from the HTs. If there are 8 Hash Units, 16 SU Pools, and 64 SBQs, 8 consecutive bytes from the LAQ (Byte[0:7]→Byte[8:15]→ . . . →Byte[56:63]) can be launched every clock cycle. The first set of 8 bytes will use Pool[0:7], the second set of 8 bytes will use Pool[8:15], the third set of 8 bytes will use Pool[0:7], the fourth set of 8 bytes will use Pool[8:15], and so on. The hardware pipeline timing can vary based on several factors: the number of valid HBAs in the HTs and string match length.

The HU will read the SBQs to check the state of the SBQs. When the corresponding SBQs become available, the HU will update the SBQs with the HBAs from the HTs. An arbiter will use the information in the SBQs to dispatch jobs to the corresponding SU pools. At a HB compare boundary, the SUs will update the SBQs until the search is complete. The SUs will post the results in the SBQs.

The compression engine can apply various lossless compression algorithms, including one or more of LZ family including, but not limited to, LZ77, LZ4, LZS, Zstandard, DEFLATE (not shown), Huffman coding, and Snappy standards and derivatives.

Figure 5:
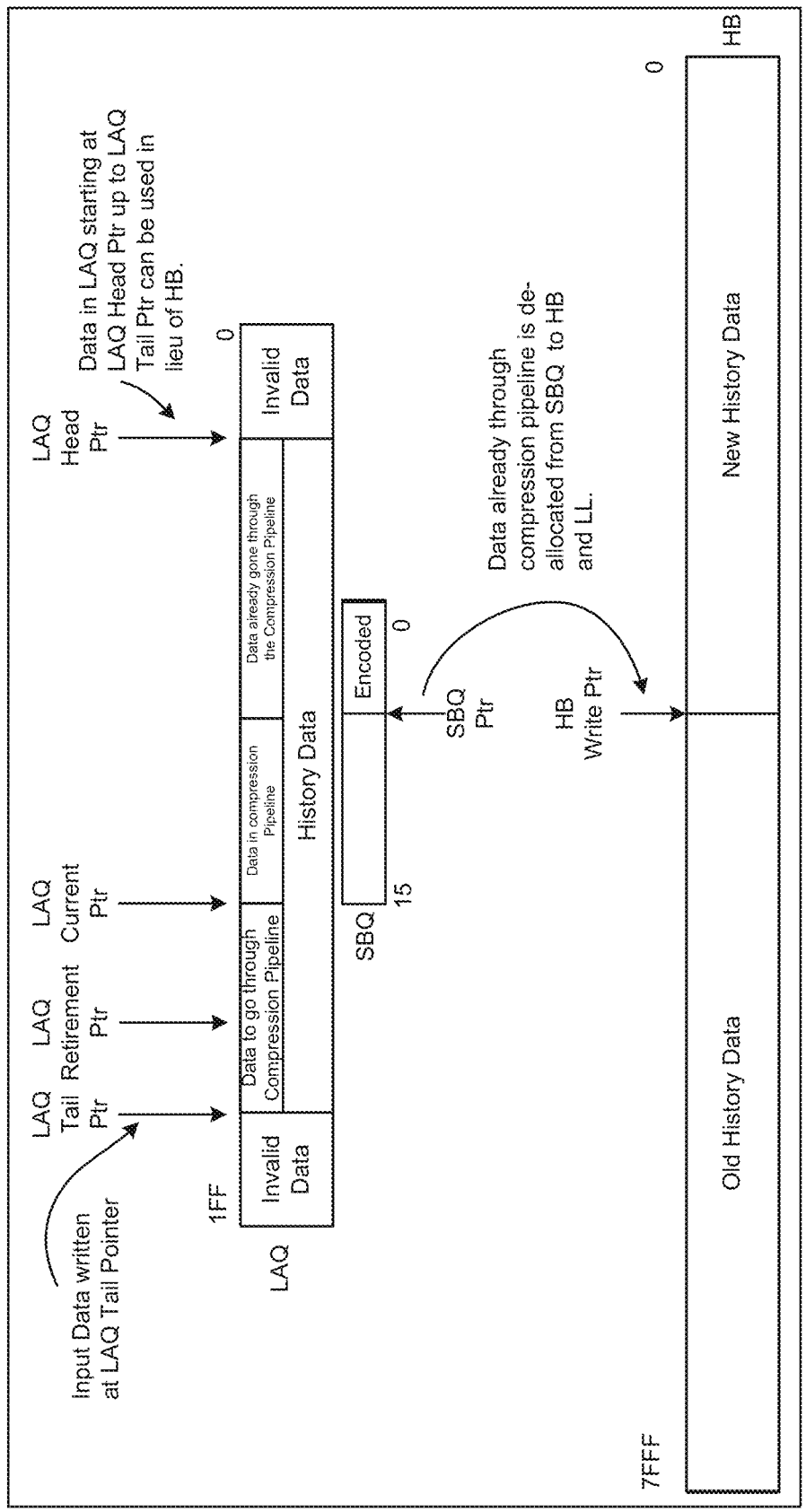
FIG. 5 shows a relationship between pointers and data in accordance with an embodiment.

FIG. 5 shows a relationship between LAQ pointers and HB write pointer. Input data is written at a LAQ tail pointer. An LAQ retirement pointer indicates a position of the input data that has not been encoded into an LZ77 stream and is next in line to be encoded. LAQ current pointer identifies the point at which the next data is to enter the compression pipeline (e.g., read by the HUs). LAQ head pointer can be used to mark the point of oldest data in the LAQ, which was already flushed to the HB, but is being retained in the LAQ. HB write pointer indicates data that has been compressed and is de-allocated from SBQ for storage into history buffer. Data starting from the head pointer to the current pointer can be flushed to the history buffer. SBQ pointer refers to a point where data is flushed from the LAQ to the HB.

Figure 6:
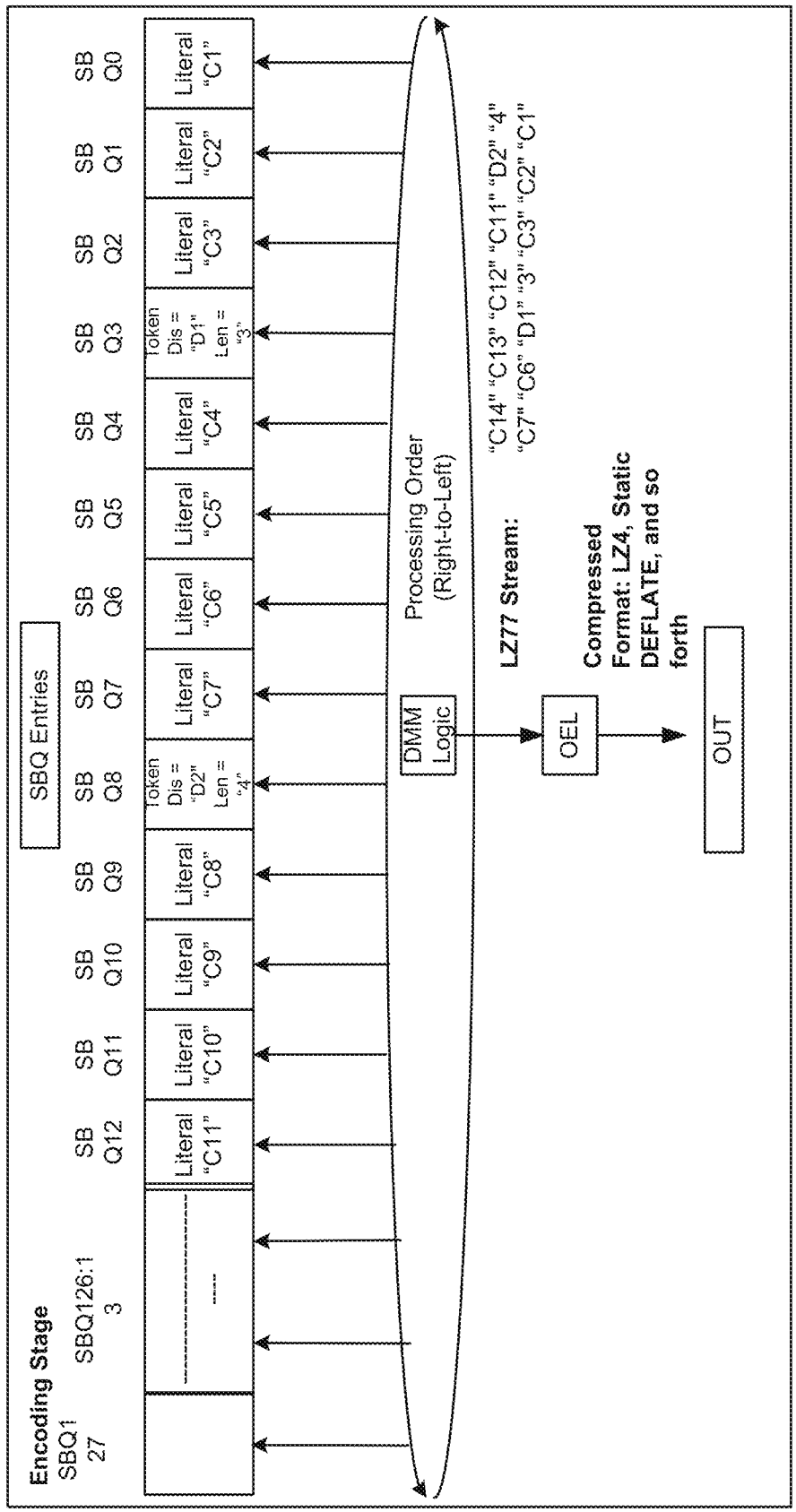
FIG. 6 depicts an example encoding stage in accordance with an embodiment.

FIG. 6 depicts an example encoding stage. The encoding stage includes results merge, deallocation and delayed match mode (DDMM), and Compressed Format Encoding. The results from an SBQ entry are resolved to select the best result and followed by deallocating the SBQ entry. DDMM takes the merged results of adjacent SBQ entries and produces an LZ77 stream. If SBQ Entry[x] with a match (token) length of "n" is selected for encoding, the DDMM will set the squash bits in SBQ Entry[x+1:x+n−1] to cause the associated results to be skipped and not included in the LZ77 stream. DDMM Logic 116 will also update the retirement pointer as follows: LAQ Current Pointer+"n". If a literal is selected from an SBQ Entry, the retirement pointer will be incremented by 1.

Figure 7:
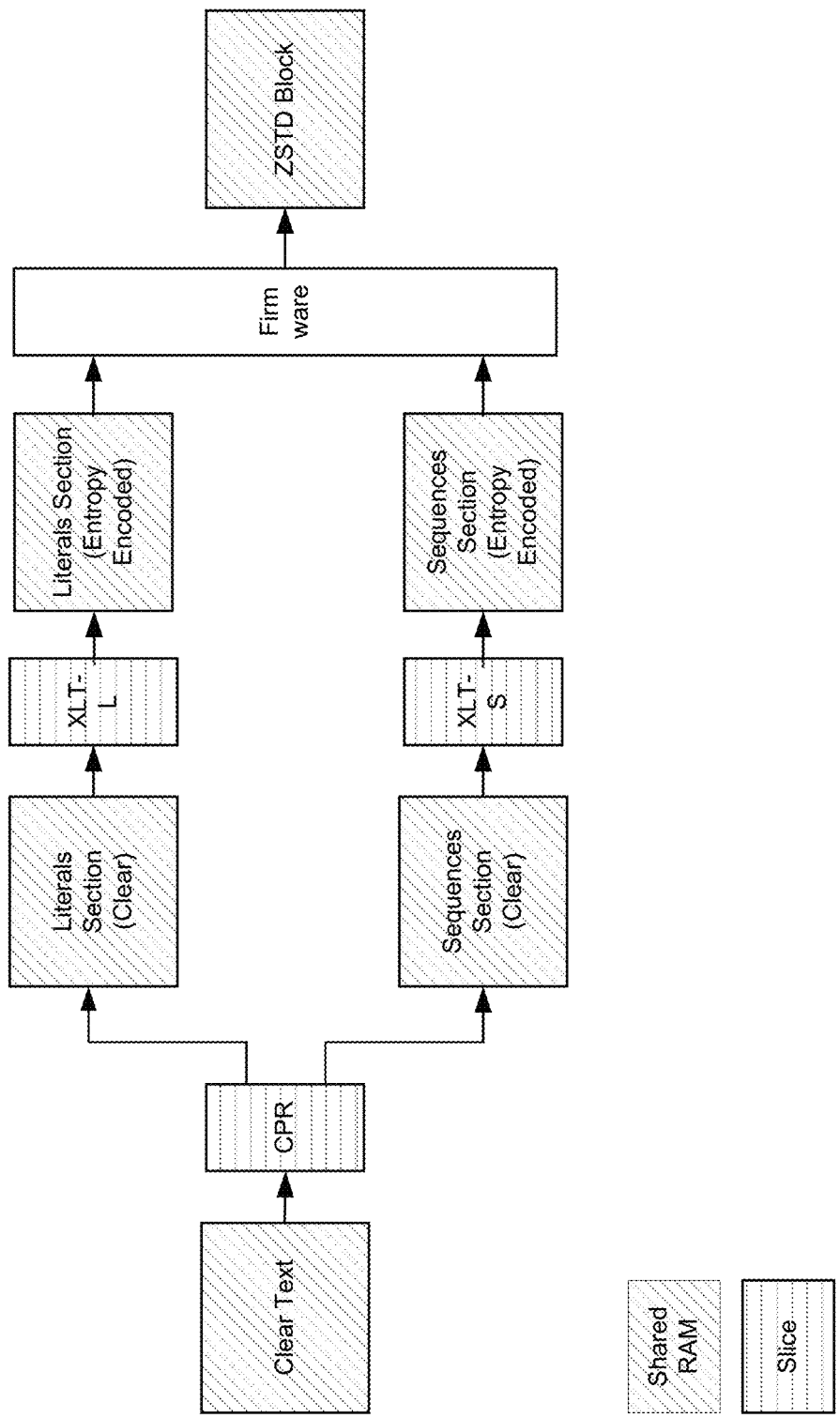
FIG. 7 depicts an example ZSTD compression in accordance with an embodiment.

FIG. 7 depicts an example of ZSTD compression. ZSTD compression can use an LZ77 input stream and possibly entropy encoding, which therefore involves several actions. ZSTD compression can use 3 slices: compression slice (CPR), translator for literals (XLT-L), and translator for sequences (XLT-S). CPR can perform the LZ77 compression and produce the data blocks: literals section and sequences (e.g., token) section. XLT-L block is used to entropy encode the literals of an LZ77 stream. XLT-S is used to entropy encode the sequences of an LZ77 stream. A literals section header can be formed and pre-pended to the entropy encoded literals section. A sequences section header can be formed and pre-pended to the entropy encoded sequences section. The block header can be formed and pre-pended to the combined literals section and sequences section.

Figure 8A:
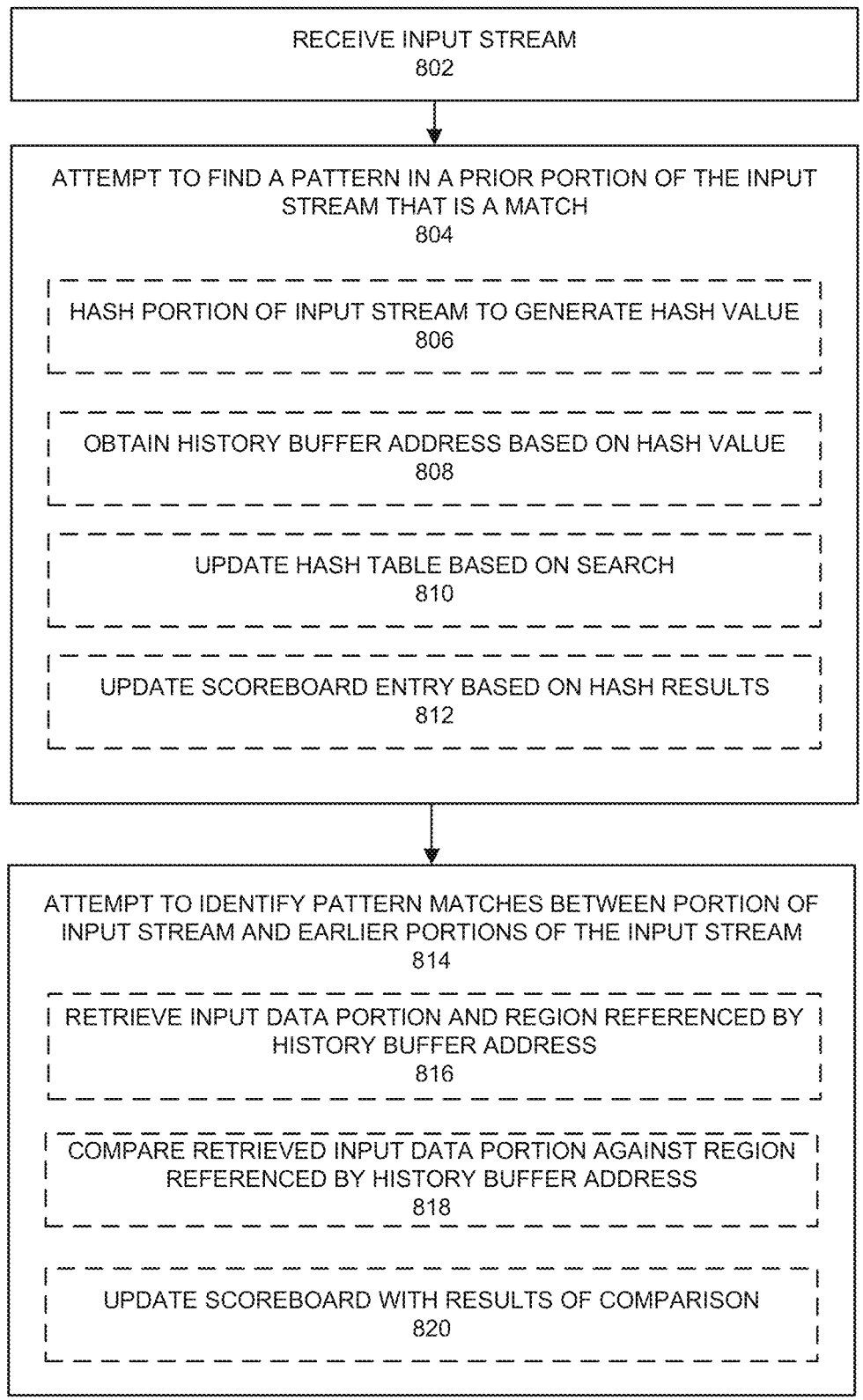
FIGS. 8A and 8B depicts an example process that can be performed in accordance with an embodiment.
Figure 8B:
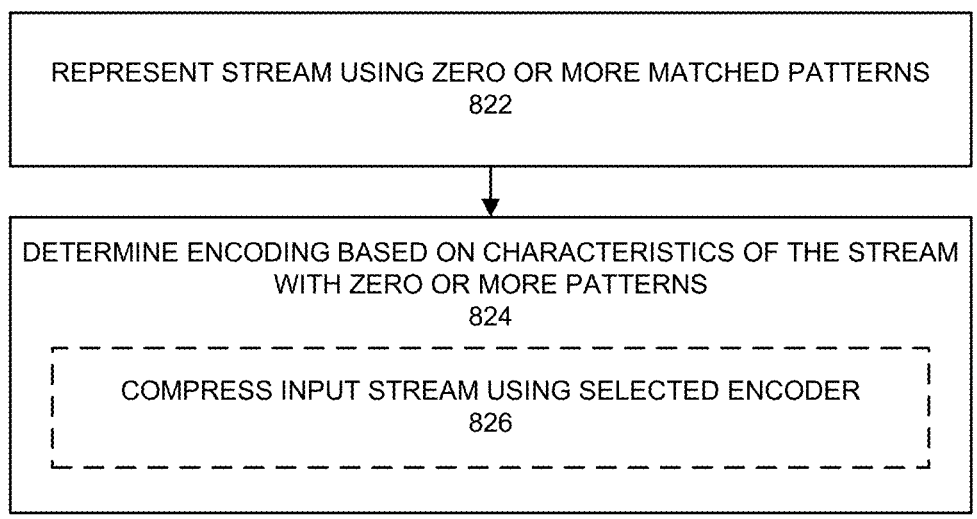

FIGS. 8A and 8B depict an example process that can be performed. The process can be performed by a CPU, network interface device or controller, offload engine, network interface products, hardware accelerator devices, or any device or software. Various embodiments can be used with lossless searching mechanisms for inline or lookaside data inputs for example in network interface controller or device or central processing unit implementations.

Referring to FIG. 8A, at 802, an input stream can be received. An input stream can include a text file, media file, image, video, audio, or other content. The input stream can be of a certain size or length. The input stream can include plain text or clear text data and can be any format (e.g., ASCII, UTF-8, among others). At 804, a search can occur to attempt to find a pattern in a prior portion of the input stream that is a match. For example, action 804 can include one or more of actions 806, 808, 810, and 812. For example, at 806, a hash of a segment of the input stream is made to generate a hash value. In some cases, 3 bytes or 4 bytes of the input stream can be hashed to generate a hash value. At 808, a history buffer address can be obtained based on the hash value. For example, a hash table that associates history buffer addresses with hash values. In some examples, multiple hash values can be generated in parallel and used to look-up multiple history buffer addresses. At 810, the hash table can be updated with the address of a leading byte hashed in 806. The oldest HBA can be evicted and the address of the leading byte (stream position) is written as the newest (and closest) HBA to-be. At 812, a scoreboard entry corresponding to the portion of the input stream that was used to generate a hash value can be updated with the determined history buffer addresses. If no HBA is found, there is an associated valid bit for each HBA from the Hash Unit with an indication of invalid.

At 814, an attempt is made to identify pattern matches between a portion of input stream and earlier portions of the input stream. For example, action 814 can include one or more of actions 816, 818, and 820. For example, at 816, one or more search units access a portion of an input stream and the region referenced by a history buffer address. At 818, a comparison is made between the portion of an input stream and the region referenced by a history buffer address. At 820, the scoreboard is updated with the results of the comparison. For example, if there is a match of any characters between the portion of an input stream and the region referenced by a history buffer address, then a match can be indicated in the scoreboard. If no match is found between any characters of the group position, a match length of zero can be provided. The comparison (by the SU) can result in any length from 0 (no match whatsoever) up to the maximum match length. Action 822 of FIG. 8B can follow action 820.

Referring to FIG. 8B, at 822, the input stream can be represented using zero or more patterns identified based on matched patterns. To select a result from multiple matches, a result with a longest character length match can be chosen. If lengths of character matches of several search results are the same, a result with the smallest offset (Dis) is selected. The input stream can be converted into an LZ77 stream that includes literals and selected tokens (e.g., represented using character length (Len) and distance (Dis)), if any. At 824, an encoding scheme can be selected based on characteristics of the stream with zero or more patterns. An encoding scheme can be chosen based on one or more of the following: type and size of an input stream, a length of a pattern, a distance from a start of where the pattern is to be inserted to the beginning of where the pattern occurred previously, a gap between two pattern matches (including different or same patterns), standard deviation of a length of a pattern, standard deviation of a distance from a start of where the pattern is to be inserted to the beginning of where the pattern occurred previously, or standard deviation of a gap between two pattern matches. An encoding scheme can be one or more of, but not limited to, LZ77, LZ4, LZS, Zstandard, DEFLATE, Huffman coding, and Snappy standards and derivatives. At 826, the input stream can be compressed using the selected encoder. The compressed input stream can be available for transmission or storage. Subsequently, the compressed input stream can be decompressed or decoded.

Figure 9:
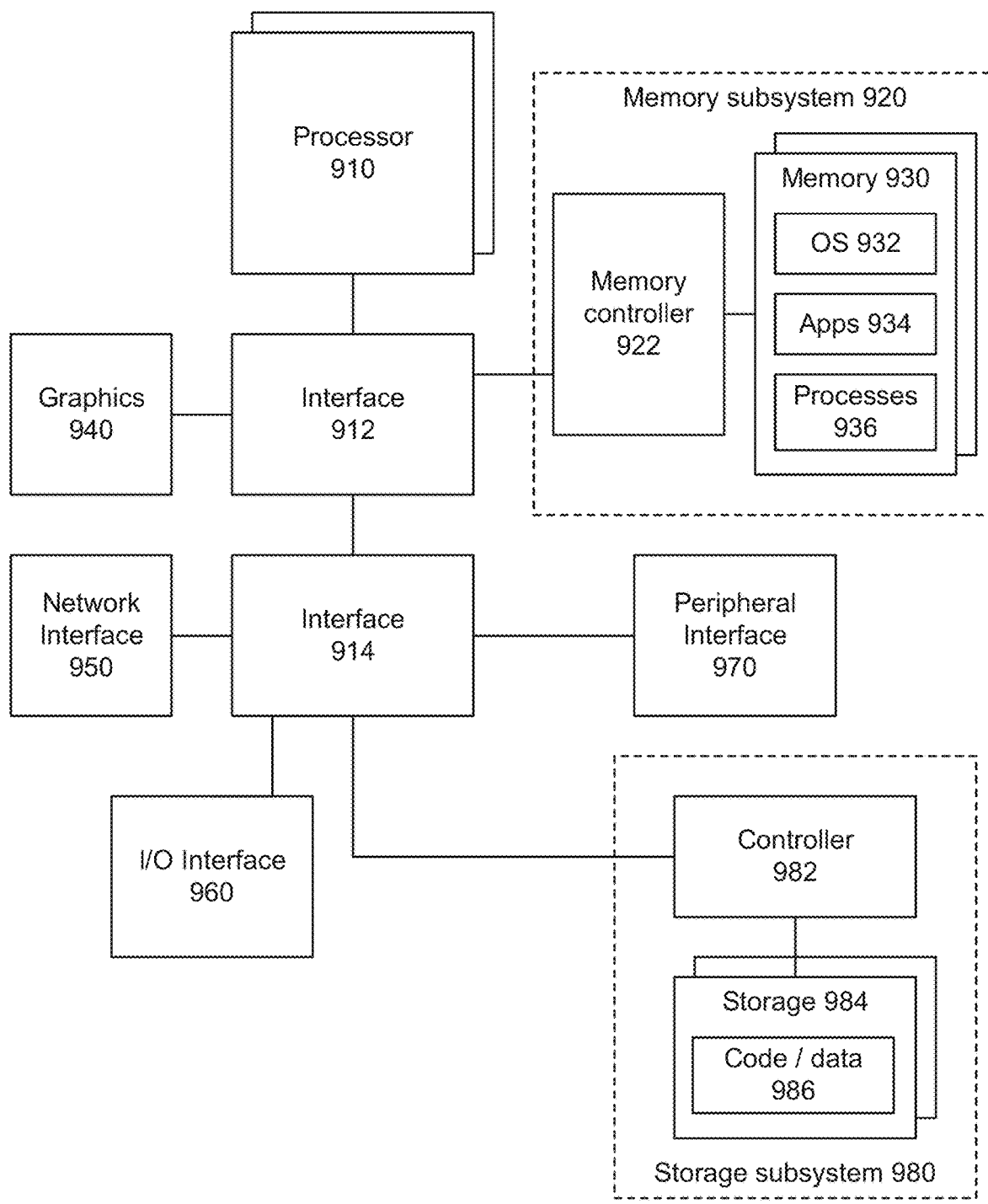
FIG. 9 depicts an example system in accordance with some embodiments in accordance with an embodiment.

FIG. 9 depicts a system. The system can use embodiments described herein. System 900 includes processor 910, which provides processing, operation management, and execution of instructions for system 900. Processor 910 can include any type of microprocessor, central processing unit (CPU), graphics processing unit (GPU), processing core, or other processing hardware to provide processing for system 900, or a combination of processors. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 900 includes interface 912 coupled to processor 910, which can represent a higher speed interface or a high throughput interface for system components that needs higher bandwidth connections, such as memory subsystem 920 or graphics interface components 940. Interface 912 represents an interface circuit, which can be a standalone component or integrated onto a processor die. Where present, graphics interface 940 interfaces to graphics components for providing a visual display to a user of system 900. In one example, graphics interface 940 can drive a high definition (HD) display that provides an output to a user. High definition can refer to a display having a pixel density of approximately 100 PPI (pixels per inch) or greater and can include formats such as full HD (e.g., 1080 p), retina displays, 4K (ultra-high definition or UHD), or others. In one example, the display can include a touchscreen display. In one example, graphics interface 940 generates a display based on data stored in memory 930 or based on operations executed by processor 910 or both. In one example, graphics interface 940 generates a display based on data stored in memory 930 or based on operations executed by processor 910 or both.

Memory subsystem 920 represents the main memory of system 900 and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 900 includes interface 914, which can be coupled to interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can transmit data to a remote device, which can include sending data stored in memory. Network interface 950 can receive data from a remote device, which can include storing received data into memory. Various embodiments can be used in connection with network interface 950, processor 910, and memory subsystem 920.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 990 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910 or can include circuits or logic in both processor 910 and interface 914.

A power source (not depicted) provides power to the components of system 900. More specifically, power source typically interfaces to one or multiple power supplies in system 900 to provide power to the components of system 900. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 900 can be implemented using interconnected compute sleds of processors, memories, storages, network interfaces, and other components. High speed interconnects can be used such as PCIe, Ethernet, or optical interconnects (or a combination thereof).

Figure 10:
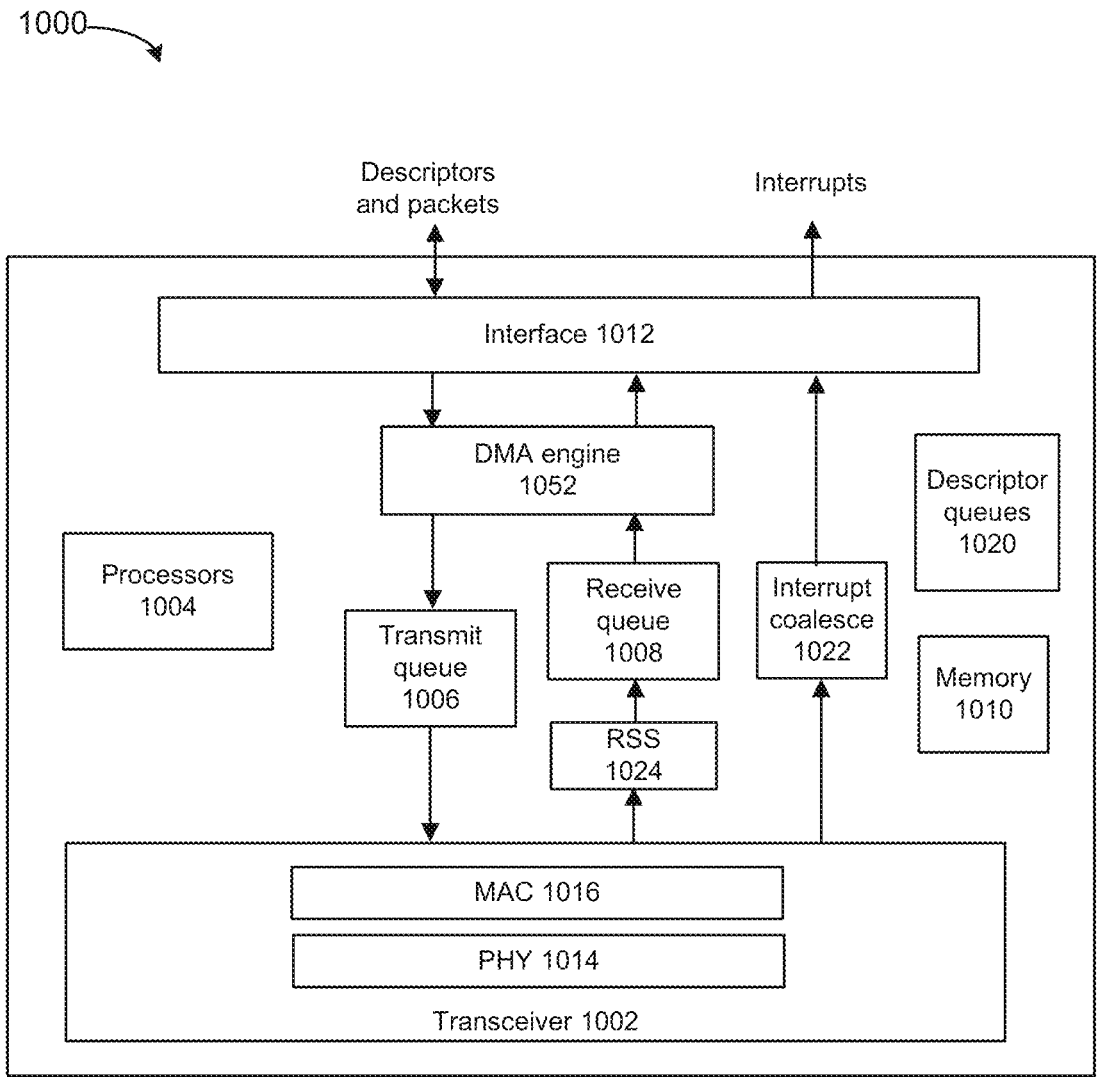
FIG. 10 depicts an example network interface in accordance with some embodiments in accordance with an embodiment.

FIG. 10 depicts a network interface. Various embodiments can use the network interface or be used by the network interface. Network interface 1000 can use transceiver 1002, processors 1004, transmit queue 1006, receive queue 10010, memory 1010, and bus interface 1012, and DMA engine 1052. Transceiver 1002 can be capable of receiving and transmitting packets in conformance with the applicable protocols such as Ethernet as described in IEEE 802.3, although other protocols may be used. Transceiver 1002 can receive and transmit packets from and to a network via a network medium (not depicted). Transceiver 1002 can include PHY circuitry 1014 and media access control (MAC) circuitry 1016. PHY circuitry 1014 can include encoding and decoding circuitry (not shown) to encode and decode data packets according to applicable physical layer specifications or standards. MAC circuitry 1016 can be configured to assemble data to be transmitted into packets, that include destination and source addresses along with network control information and error detection hash values. Processors 1004 can be any a combination of a: processor, core, graphics processing unit (GPU), field programmable gate array (FPGA), application specific integrated circuit (ASIC), or other programmable hardware device that allow programming of network interface 1000. For example, processors 1004 can provide for identification of a resource to use to perform a workload and generation of a bitstream for execution on the selected resource. For example, a "smart network interface" can provide packet processing capabilities in the network interface using processors 1004.

Packet allocator 1024 can provide distribution of received packets for processing by multiple CPUs or cores using timeslot allocation described herein or RSS. When packet allocator 1024 uses RSS, packet allocator 1024 can calculate a hash or make another determination based on contents of a received packet to determine which CPU or core is to process a packet.

Interrupt coalesce 1022 can perform interrupt moderation whereby network interface interrupt coalesce 1022 waits for multiple packets to arrive, or for a time-out to expire, before generating an interrupt to host system to process received packet(s). Receive Segment Coalescing (RSC) can be performed by network interface 1000 whereby portions of incoming packets are combined into segments of a packet. Network interface 1000 provides this coalesced packet to an application.

Direct memory access (DMA) engine 1052 can copy a packet header, packet payload, and/or descriptor directly from host memory to the network interface or vice versa, instead of copying the packet to an intermediate buffer at the host and then using another copy operation from the intermediate buffer to the destination buffer.

Memory 1010 can be any type of volatile or non-volatile memory device and can store any queue or instructions used to program network interface 1000. Transmit queue 1006 can include data or references to data for transmission by network interface. Receive queue 10010 can include data or references to data that was received by network interface from a network. Descriptor queues 1020 can include descriptors that reference data or packets in transmit queue 1006 or receive queue 10010. Bus interface 1012 can provide an interface with host device (not depicted). For example, bus interface 1012 can be compatible with PCI, PCI Express, PCI-x, Serial ATA, and/or USB compatible interface (although other interconnection standards may be used).

Figure 11:
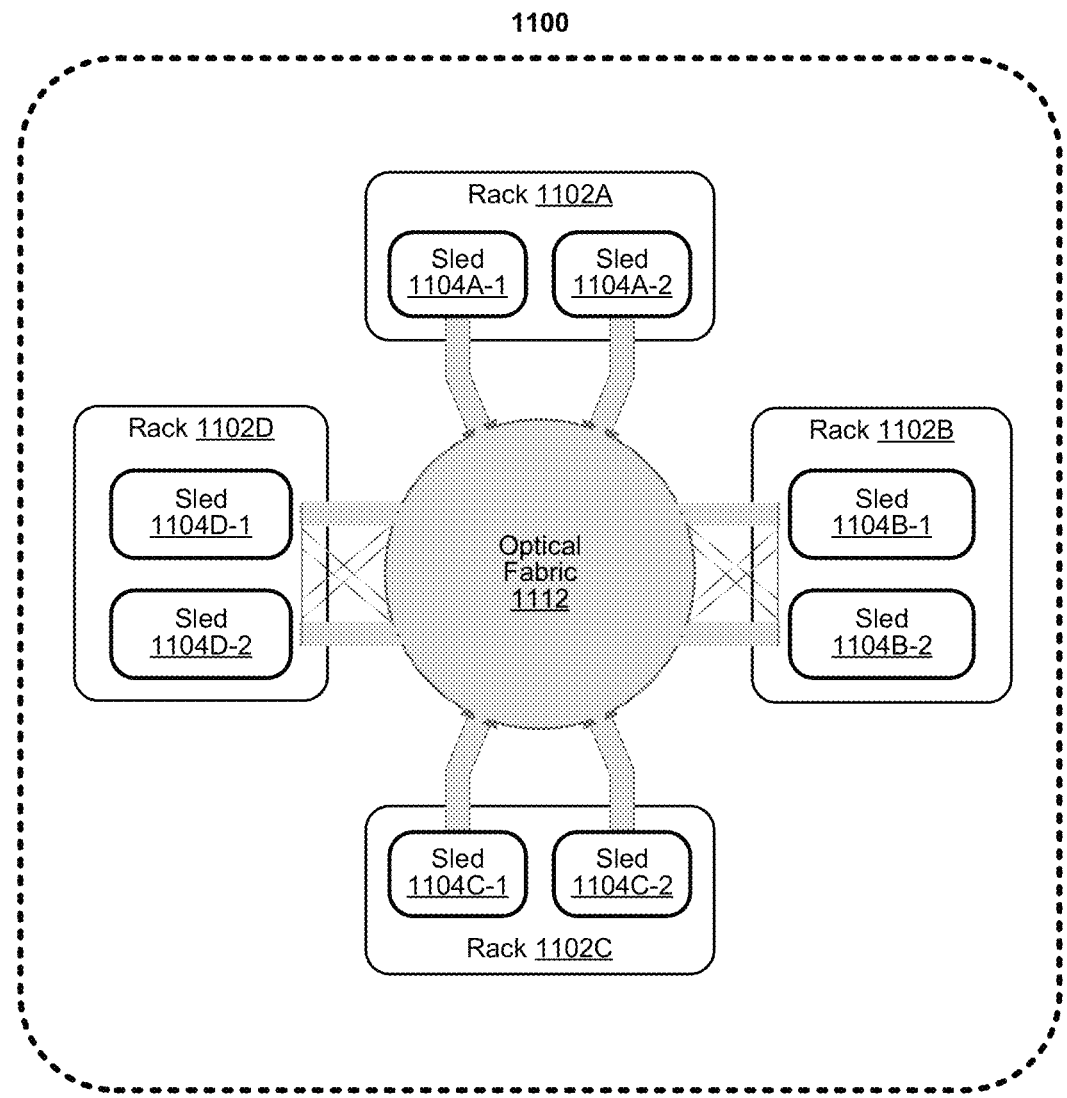
FIG. 11 depicts an example switch in accordance with some embodiments in accordance with an embodiment.

FIG. 11 depicts an example of a data center. Various embodiments can be used in or with the data center of FIG. 11. As shown in FIG. 11, data center 1100 may include an optical fabric 1112. Optical fabric 1112 may generally include a combination of optical signaling media (such as optical cabling) and optical switching infrastructure via which any particular sled in data center 1100 can send signals to (and receive signals from) the other sleds in data center 1100. The signaling connectivity that optical fabric 1112 provides to any given sled may include connectivity both to other sleds in a same rack and sleds in other racks. Data center 1100 includes four racks 1102A to 1102D and racks 1102A to 1102D house respective pairs of sleds 1104A-1 and 1104A-2, 1104B-1 and 1104B-2, 1104C-1 and 1104C-2, and 1104D-1 and 1104D-2. Thus, in this example, data center 1100 includes a total of eight sleds. Optical fabric 11012 can provide sled signaling connectivity with one or more of the seven other sleds. For example, via optical fabric 11012, sled 1104A-1 in rack 1102A may possess signaling connectivity with sled 1104A-2 in rack 1102A, as well as the six other sleds 1104B-1, 1104B-2, 1104C-1, 1104C-2, 1104D-1, and 1104D-2 that are distributed among the other racks 1102B, 1102C, and 1102D of data center 1100. The embodiments are not limited to this example. For example, fabric 1112 can provide optical and/or electrical signaling.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Example 1 includes an apparatus comprising: a memory and at least one processor, the at least one processor to: select a compression scheme for an input stream based on characteristics of the input stream and apply the selected compression scheme to a representation of the input stream.

Example 2 includes the subject matter of Example 1, wherein to select a compression scheme for an input stream based on characteristics of the input stream, the at least one processor is to: determine one or more matches of character strings in the input stream, the one or more matches comprising a length of a character string and distance from the character string to a prior occurrence of the character string.

Example 3 includes the subject matter of any of Examples 1-2, wherein to select a compression scheme for an input stream based on characteristics of the input stream, the at least one processor is to: determine a gap between two character string matches, wherein the two character string matches comprise matches of the same character string or different character strings.

Example 4 includes the subject matter of any of Examples 1-3, wherein to select a compression scheme for an input stream based on characteristics of the input stream, the at least one processor is to: determine one or more of: standard deviation of length of a character string, standard deviation of distance from a start of where the character string is to be inserted to the beginning of where the character string began in a prior occurrence, or standard deviation of gap between two character string matches.

Example 5 includes the subject matter of any of Examples 1-4, wherein the characteristics of the input stream comprise one or more of: type of the input stream, size of the input stream, a length of a character string, a distance from a start of where the character string is located in the input stream to the beginning of where the character string previously occurred in the input stream, a gap between two character string matches, wherein the two character string matches comprise matches of the same character string or different character strings, standard deviation of length of the character string, standard deviation of distance from a start of where the character string is to be inserted to the beginning of where the character string began, or standard deviation of a gap between two character string matches.

Example 6 includes the subject matter of any of Examples 1-5, wherein the selected compression scheme comprises one or more of: LZ4, LZS, Zstandard, DEFLATE, Huffman coding, and Snappy standards.

Example 7 includes the subject matter of any of Examples 1-6, comprising a network interface, compute sled, or data center computing platform.

Example 8 includes a method comprising: receiving an input stream; determining if a portion of the input stream is a repeat of an earlier portion of the input stream; selecting a compression scheme for an input stream based on any determined portion that is repeat of an earlier portion and one or more other characteristics of the input stream; and causing the selected compression scheme to be applied to a representation of the input stream.

Example 9 includes the subject matter of Example 8, wherein the determining if a portion of the input stream is a repeat of an earlier portion of the input stream comprises: hashing a portion of the input stream; determining an address associated with the portion; searching the input stream for a repeated earlier portion based on the address; and identifying a repeated portion.

Example 10 includes the subject matter of any of Examples 8-9, wherein the identifying a repeated portion comprises identifying a length of a character string and a distance from a start of where the character string is located in the input stream to the beginning of where the character string previously occurred in the input stream.

Example 11 includes the subject matter of any of Examples 8-10, wherein selecting a compression scheme for an input stream based on any determined portion that is repeat of an earlier portion and one or more other characteristics of the input stream comprises selecting the compression scheme for an input stream based on one or more of: type of the input stream, size of the input stream, a length of a character string, a distance from a start of where the character string is located in the input stream to the beginning of where the character string previously occurred in the input stream, a gap between two character string matches, wherein the two character string matches comprise matches of the same character string or different character strings, standard deviation of length of the character string, standard deviation of distance from a start of where the character string is to be inserted to the beginning of where the character string began, or standard deviation of a gap between two character string matches.

Example 12 includes the subject matter of any of Examples 8-11, wherein the type of the input stream comprises one or more of: text, image, picture, video, audio, or media.

Example 13 includes the subject matter of any of Examples 8-12, comprising converting the input stream to an LZ77 format representation of the input stream.

Example 14 includes the subject matter of any of Examples 8-13, wherein the compression scheme comprises one or more of: LZ4, LZS, Zstandard, DEFLATE, Huffman coding, and Snappy standards.

Example 15 includes the subject matter of any of Examples 8-14, wherein the method is performed using one or more of: a network interface, central processing unit, data center, compute sled, or offload engine.

Example 16 includes a system comprising: a network interface; at least one processor communicatively coupled to the network interface, the at least one processor to: receive an input stream of a type and length; store a portion of the input stream; search the portion of the input stream to find any matches of the portion; select an encoding scheme to use on the input stream based at least in part on one or more of: the type, the length, or the size of any match; and apply the selected encoding scheme to a representation of the input stream.

Example 17 includes the subject matter of Example 16, wherein to select an encoding scheme to use on the input stream based at least in part on one or more of the type, the length, or the size of any match, the at least one processor is to select the encoding scheme based on one or more of: type of the input stream, size of the input stream, a length of a character string, a distance from a start of where the character string is located in the input stream to the beginning of where the character string previously occurred in the input stream, a gap between two character string matches, wherein the two character string matches comprise matches of the same character string or different character strings, standard deviation of length of the character string, standard deviation of distance from a start of where the character string is to be inserted to the beginning of where the character string began, or standard deviation of a gap between two character string matches.

Example 18 includes the subject matter of any of Examples 16-17, wherein the at least one processor is to convert the input stream into an LZ77 format representation of the input stream.

Example 19 includes the subject matter of any of Examples 16-18, wherein the compression scheme comprises one or more of: LZ4, LZS, Zstandard, DEFLATE, Huffman coding, and Snappy standards.

Example 20 includes the subject matter of any of Examples 16-19, wherein the network interface is to transmit the encoded input stream.

APPENDIX 1

Static DEFLATE Encoding

A static deflate block is made up of a 3-bit header, followed by the compressed data. For static deflate the LZ77 stream is encoded using a look-up table. Symbols in the LZ77 stream are substituted with a corresponding static code from the look-up table. A stored block is simply a copy of an uncompressed data block, for example, a block of literals.

Static Huffman Coding

Static DEFLATE is encoded using two distinct fixed code alphabets: Literal/Length and Distance. Literal and Length symbols are combined and represented using a single alphabet (0-287), and Distance symbols are represented using a different alphabet (0-31). From the Literal/Length alphabet, Symbols (0-255) represent Literals (0-255), symbol 256 represents End-Of-Block, and Symbols (257-285) with extra bits represent Lengths (3-258). From the Distance alphabet, symbols (0-29) with extra bits represent distances (1-32768).

As an example, Literal 144 would be encoded using a 9-bit code as "110010000". To encode Length 100, the base Length symbol is drawn as symbol 279 and requires 4 extra bits. The 4 extras bits would be encoded as "0001". And now symbol 279 would be encoded using code "0010111". Now combining the base code and the extra bits, Length 100 would be encoded as "0010111" "0001".

Static Literal/Length Alphabet

| Literal/length Codes | Number of Bits Used | Literal/Length |
|---|---|---|
| 0011000-10111111 | 8 | 0-143 |
| 110010000-111111111 | 9 | 144-255 |
| 0000000-0010111 | 7 | 256-279 |
| 11000000-11000111 | 8 | 280-287 |

Static Length Code Alphabet and Extra Bits

| Length Code | Extra Bits Used | Length |
|---|---|---|
| 257 | 0 | 3 |
| 258 | 0 | 4 |
| 259 | 0 | 5 |
| 260 | 0 | 6 |
| 261 | 0 | 7 |
| 262 | 0 | 8 |
| 263 | 0 | 9 |
| 264 | 0 | 10 |
| 265 | 1 | 11, 12 |
| 266 | 1 | 13, 14 |
| 267 | 1 | 15, 16 |
| 268 | 1 | 17, 18 |
| 269 | 2 | 19-22 |
| 270 | 2 | 23-26 |
| 271 | 2 | 27-30 |
| 272 | 2 | 31-34 |
| 273 | 3 | 35-42 |
| 274 | 3 | 43-50 |
| 275 | 3 | 51-58 |
| 276 | 3 | 59-66 |
| 277 | 4 | 67-82 |
| 278 | 4 | 83-98 |
| 279 | 4 | 99-114 |
| 280 | 4 | 115-130 |
| 281 | 5 | 131-162 |
| 282 | 5 | 163-194 |
| 283 | 5 | 195-226 |
| 284 | 5 | 227-257 |
| 285 | 0 | 258 |

Static Distance Code Alphabet and Extra Bits

| Distance Code | Extra Bits Used | Distance |
|---|---|---|
| 0 | 0 | 1 |
| 1 | 0 | 2 |
| 2 | 0 | 3 |
| 3 | 0 | 4 |
| 4 | 1 | 5, 6 |
| 5 | 1 | 7, 8 |
| 6 | 2 | 9-12 |
| 7 | 2 | 13-16 |
| 8 | 3 | 17-24 |
| 9 | 3 | 25-32 |
| 10 | 4 | 33-48 |
| 11 | 4 | 49-64 |
| 12 | 5 | 65-96 |
| 13 | 5 | 97-128 |
| 14 | 6 | 129-192 |
| 15 | 6 | 193-256 |
| 16 | 7 | 257-384 |
| 17 | 7 | 385-512 |
| 18 | 8 | 513-768 |
| 19 | 8 | 769-1024 |
| 20 | 9 | 1025-1536 |
| 21 | 9 | 1537-2048 |
| 22 | 10 | 2049-3072 |
| 23 | 10 | 3073-4096 |
| 24 | 11 | 4097-6144 |
| 25 | 11 | 6145-8192 |
| 26 | 12 | 8193-12288 |
| 27 | 12 | 12289-16384 |
| 28 | 13 | 16385-24576 |
| 29 | 13 | 24577-32768 |

LZ4 Encoding

The expectation is that LZ4 will be supported using the LZ4 Streaming Format and not as a single compressed block. The LZ4 Streaming Format dictates that the clear text per input block cannot exceed the LBMS programmable size of: 64 KB, 256 KB, 1 MB, or 4 MB. The LZ4 Streaming Format can also contain uncompressed LZ4 blocks in the stream.

The OEL support a 1 KB literal buffer. An LZ4 sequence can only be encoded when a match occurs as both the match and the literal string info are needed in order to encode the LZ4 sequence header, which is at the head of the LZ4 sequence. During the encoding process when the OEL encounters a literal from the DMM Logic, the OEL will insert the literal into the literal buffer. Consecutive literals will be buffered until a match or the literal buffer fills up. If the literal buffer fills up, the LZ4 sequence will be encoded as the last sequence of the LZ4 block and an End of LZ4 Block exception will be raised. If a match is encountered prior to the literal buffer filling up, the LZ4 sequence is encoded with literals and a match. Assuming the literal buffer never fills up, the LZ4 encoding process will continue until either the output buffer overflows or the input data is exhausted. During the encoding process, if the DMM Logic drives back to back match, the LZ4 sequence for the following match will be encoded with only a match—no literals. The last LZ4 sequence of the LZ4 block must be encoded with only literals.

What is claimed is:

1. An apparatus comprising:
an interface and
circuitry, coupled to the interface, wherein the circuitry, when operational, is to:
encode an input stream using an encoding scheme;
select a second compression scheme from among multiple compression schemes for the encoded input stream based on characteristics of the encoded input stream, wherein to select a second compression scheme from among multiple compression schemes for the encoded input stream based on characteristics of the encoded input stream, the circuitry is to determine a gap between two character string matches, wherein the two character string matches comprise matches with a same character string or different character string and wherein the second compression scheme and the encoding scheme are different;
apply the selected second compression scheme to the encoded input stream; and
output the encoded input with an applied selected second compression scheme.

2. The apparatus of claim 1, wherein the encoding scheme comprises Lempel-Ziv LZ77.

3. The apparatus of claim 1, wherein to select a second compression scheme from among multiple compression schemes for the encoded input stream based on characteristics of the encoded input stream, the circuitry is to:
determine one or more matches of character strings in the input stream, the one or more matches comprising a length of a character string and distance from the character string to a prior occurrence of the character string.

4. The apparatus of claim 1, wherein to select a second compression scheme from among multiple compression schemes for the encoded input stream based on characteristics of the encoded input stream, the circuitry is to:
determine one or more of: standard deviation of length of a character string, standard deviation of distance from a start of where the character string is to be inserted to a beginning of where the character string began in a prior occurrence, or standard deviation of gap between two character string matches.

5. The apparatus of claim 1, wherein the multiple compression schemes comprise two or more of: LZ4, LZS, Zstandard, DEFLATE, Huffman coding, and Snappy standards.

6. The apparatus of claim 1, comprising a network interface, compute sled, or data center computing platform, wherein the network interface, compute sled, or data center computing platform includes the circuitry.

7. The apparatus of claim 1, comprising:
a network interface controller coupled to the circuitry, wherein the network interface controller comprises:
at least one memory, when operational, to store one or more descriptors and
at least one processor, when operational, to process a packet prior to transmission or process a second packet after receipt.

8. The apparatus of claim 1, wherein the characteristics of the encoded input stream are based on at least one character string match in another portion of the input stream.

9. A method comprising:
encoding an input stream using an encoding scheme;
selecting a second compression scheme from among multiple compression schemes for the encoded input stream based on characteristics of the encoded input stream, wherein the second compression scheme and the encoding scheme are different and wherein selecting a second compression scheme from among multiple compression schemes for the encoded input stream based on characteristics of the encoded input stream comprises determining one or more of: standard deviation of length of a character string, standard deviation of distance from a start of where the character string is to be inserted to a beginning of where the character string began in a prior occurrence, or standard deviation of gap between two character string matches;
applying the selected second compression scheme to the encoded input stream; and
outputting the encoded input with an applied selected second compression scheme.

10. The method of claim 9, wherein the encoding scheme comprises Lempel-Ziv LZ77.

11. The method of claim 9, wherein selecting a second compression scheme from among multiple compression schemes for the encoded input stream based on characteristics of the encoded input stream comprises:
determining one or more matches of character strings in the input stream, the one or more matches comprising a length of a character string and distance from the character string to a prior occurrence of the character string.

12. The method of claim 9, wherein selecting a second compression scheme from among multiple compression schemes for the encoded input stream based on characteristics of the encoded input stream comprises:
determining a gap between two character string matches, wherein the two character string matches comprise matches with a same character string or different character string.

13. The method of claim 9, wherein the multiple compression schemes comprise two or more of: LZ4, LZS, Zstandard, DEFLATE, Huffman coding, and Snappy standards.

14. The method of claim 9, comprising:
performing the encoding, selecting, applying, and outputting in one or more of: a network interface, compute sled, or data center computing platform.

15. A non-transitory computer-readable medium comprising instructions stored thereon, that if executed by one or more processors, cause the one or more processors to:
encode an input stream using an encoding scheme;
select a second compression scheme from among multiple compression schemes for the encoded input stream based on characteristics of the encoded input stream, wherein to select a second compression scheme from among multiple compression schemes for the encoded input stream based on characteristics of the encoded input stream, the one or more processors are to determine one or more of: standard deviation of length of a character string, standard deviation of distance from a start of where the character string is to be inserted to a beginning of where the character string began in a prior occurrence, or standard deviation of gap between two character string matches and wherein the second compression scheme and the encoding scheme are different;
apply the selected second compression scheme to the encoded input stream; and
output the encoded input with an applied selected second compression scheme.

16. The computer-readable medium of claim 15, wherein the encoding scheme comprises Lempel-Ziv LZ77.

17. The computer-readable medium of claim 15, wherein to select a second compression scheme from among multiple compression schemes for the encoded input stream based on characteristics of the encoded input stream, the one or more processors are to:
determine one or more matches of character strings in the input stream, the one or more matches comprising a length of a character string and distance from the character string to a prior occurrence of the character string.

18. The computer-readable medium of claim 15, wherein to select a second compression scheme from among multiple compression schemes for the encoded input stream based on characteristics of the encoded input stream, the one or more processors are to:

determine a gap between two character string matches, wherein the two character string matches comprise matches with a same character string or different character string.

19. The computer-readable medium of claim 15, wherein the multiple compression schemes comprise two or more of: LZ4, LZS, Zstandard, DEFLATE, Huffman coding, and Snappy standards.

20. The computer-readable medium of claim 15, wherein a network interface, compute sled, or data center computing platform includes the one or more processors.

* * * * *